United States Patent [19]
Nikolić et al.

[11] Patent Number: 6,107,853
[45] Date of Patent: Aug. 22, 2000

[54] SENSE AMPLIFIER BASED FLIP-FLOP

[75] Inventors: Borivoje Nikolić, San Jose; Wenyan Jia, Milpitas, both of Calif.

[73] Assignee: Texas Instruments Incorporated, Dallas, Tex.

[21] Appl. No.: 09/189,065

[22] Filed: Nov. 9, 1998

[51] Int. Cl.[7] .................................................. H03K 3/356
[52] U.S. Cl. ............................ 327/217; 327/211; 327/215
[58] Field of Search ..................................... 327/217, 208, 327/210, 211, 212, 214, 51–57

[56] References Cited

U.S. PATENT DOCUMENTS

| | | | |
|---|---|---|---|
| 4,633,098 | 12/1986 | Mahmud | 327/212 |
| 5,124,568 | 6/1992 | Chen et al. | 327/217 |
| 5,625,308 | 4/1997 | Matsumoto et al. | 327/208 |

*Primary Examiner*—Toan Tran
*Attorney, Agent, or Firm*—W. Daniel Swayze, Jr.; W. James Brady, III; Frederick J. Telecky, Jr.

[57] ABSTRACT

A flip-flop including a first stage and a second stage. The first stage receives a pair of differential signals to generate a set and reset signal. The complement of the set and reset signal generates output signals Q and Q̄. These signals have equal rising and falling transitions with the same delays for the Q signal and the Q̄ signal. The second stage has symmetrical pull-up and pull-down circuits.

5 Claims, 3 Drawing Sheets

| $\overline{S}$ | $\overline{R}$ | Q(n) | $\overline{Q}$ |
|---|---|---|---|
| 0 | 0 | n.a. | n.a. |
| 0 | 1 | 1 | 0 |
| 1 | 0 | 0 | 1 |
| 1 | 1 | Q(n-1) | $\overline{Q(n-1)}$ |

| $\overline{S}$ | $\overline{R}$ | $\overline{Q}$ | Q(n) |
|---|---|---|---|
| 0 | 0 | 0 | X |
| 0 | 0 | 1 | X |
| 0 | 1 | 0 | 1 |
| 0 | 1 | 1 | 1 |
| 1 | 0 | 0 | 0 |
| 1 | 0 | 1 | 0 |
| 1 | 1 | 0 | 1 |
| 1 | 1 | 1 | 0 |

SENSE AMPLIFIER BASED FLIP-FLOP

FIELD OF THE INVENTION

The present invention relates to digital logic circuits and more particularly to a flip-flop circuit.

BACKGROUND OF THE INVENTION

All digital systems use timing devices such as latches and flip-flops as part of the digital systems. As the operating frequencies increase and the number of logic gates between timing elements are reduced, timing constraints are reflected on the design of flip-flops. Additionally, low delay from the clock input to data output, shorter setup and hold times are required. Other critical elements of high-speed latch design are low-power operation, small size and low clock load.

The prior art has presented many flip-flop structures. One such flip-flop structure is illustrated in FIG. 1. This flip-flop has a first stage 102 and a second stage 104. The second stage 104 includes a R-S latch. The first stage 102 of this flip-flop includes a sense amplifier which is widely used in memory integrated circuits. Differential inputs of the first stage 102 sense the difference between the inputs. The inputs can be obtained from either a dual or single-rail logic. With single-rail logic, a complementary output can be generated by use of an inverter. This sense amplifier stage produces monotonous transitions from the high to low logic levels at nodes $\overline{S}$ and $\overline{R}$ on the leading clock edge and the S-R latch captures each monotonous transition and holds the state until the next leading clock edge arrives. Thus, the whole structure operates as a flip-flop.

The S-R latch operates such that the input $\overline{S}$ is a set input and $\overline{R}$ is a reset input. The low level at both $\overline{S}$ and $\overline{R}$ inputs are not permitted and that is prevented by the sense-amplifier stage 102. The low level at $\overline{S}$ sets the Q output to high, which in turn forces the $\overline{Q}$ to low. Conversely, the low level at $\overline{R}$ sets the $\overline{Q}$ to high, which in turn forces Q to low. Thus, one of the outputs is always delayed with respect to the other. The rising edge always occurs first, after one gate delay, and the falling edge occurs after two gate delays. And the worst of two delays has to be taken into account when calculating the maximum operating clock frequency. This limits the performance of prior art sense-amplifier flip-flops.

SUMMARY OF THE INVENTION

The sense-amplifier flip-flop of the present invention provides an improved output stage. The output stage has the same delays of both true Q and complementary outputs $\overline{Q}$ and the same delays for both falling and rising edges. The output stage is symmetrical, for example, a mirror image with respect to the each of the circuits which outputs signals Q and $\overline{Q}$. Additionally, the present invention includes pull-up circuits and pull-down circuits which are symmetrical with respect to each other.

Additionally, the transitions of the output signals Q and $\overline{Q}$ depend only on transitions of signals $\overline{S}$ and $\overline{R}$. As a result, the rising and falling transitions of Q and $\overline{Q}$ signals have the same delays.

Additionally, the output stage can be sized to drive a wide range of load levels since only one transistor in Q and $\overline{Q}$ branches is conducting current during the transition of the output.

When the clock signal is low, nodes $\overline{S}$ and $\overline{R}$ are precharged through two transistors. The minimization in the size of these transistors reduces the clock load. The lower bound on the size of these transistors is limited by their capacity to precharge the nodes in one half of the cycle. The high state of $\overline{S}$ and $\overline{R}$ keeps a pair of transistors on, charging their sources to a predetermined voltage since there is no path to ground due to the clocked off state of an additional transistor. The sense-amplifier stage is triggered on the leading edge of the clock. If the signal D is high, node $\overline{S}$ is discharged through a first path. If $\overline{D}$ is high, node $\overline{R}$ is discharged through a second path. After this change, additional changes of the data inputs will not affect the state of $\overline{S}$ and $\overline{R}$ nodes. The inputs are decoupled from the outputs of the sense amplifier and thus form the basis for the flip-flop operation of the circuit. The outputs of the sense amplifier which are forced low at the leading edge of the clock become floating low if the data changes after the leading edge of the clock by a node that does not have a low resistance path to either ground or supply. The voltage, as a consequence, floats between ground and supply. (Floating low means that before the node floats, the node was connected to ground through a low resistance path and then is disconnected from the low resistance path. This stores a voltage in the parasitic capacitance.) This allows static operation, providing a path to ground even though the data has changed. This prevents potential charging of the low output of the sense-amplifier stage due to the leakage currents. These leakage currents are significant in low-power designs where $V_t$ is lowered to boost performance affected by scaling of the voltage supply. This additional transistor forces the whole differential tree to be precharged and discharged in every clock cycle independent of the state of the data after the leading edge of the clock. The size of the additional transistor is minimized to prevent any significant increase in the delay of the sense-amplifier stage caused by the simultaneous discharge of both the direct path capacitive load and the load of the opposite branch through the additional transistor.

The present invention provides a S-R latch that significantly improves the speed and driving capability of the flip-flop. The S-R latch is designed to be symmetrical for both true and complementary outputs. Both pull-up and pull-down trees are symmetrical. The rise and fall delays of the pull-down tree with an inverter is matched to the delay of the pull-up tree.

DETAILED DESCRIPTION OF THE PRESENT INVENTION

Figure 1:
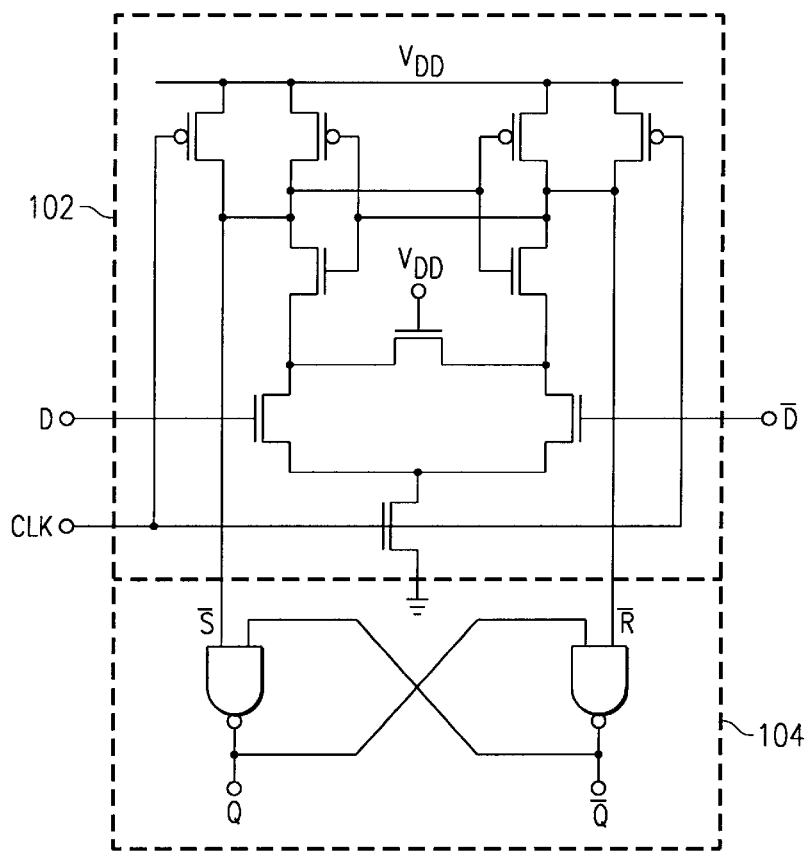
FIG. 1 illustrates a circuit of the prior art.
Figure 3:
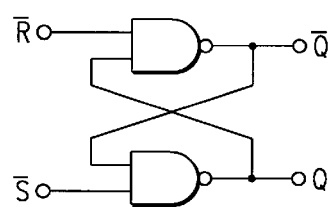
FIG. 3 illustrates a NAND based S-R latch with truth table.
Figure 2:
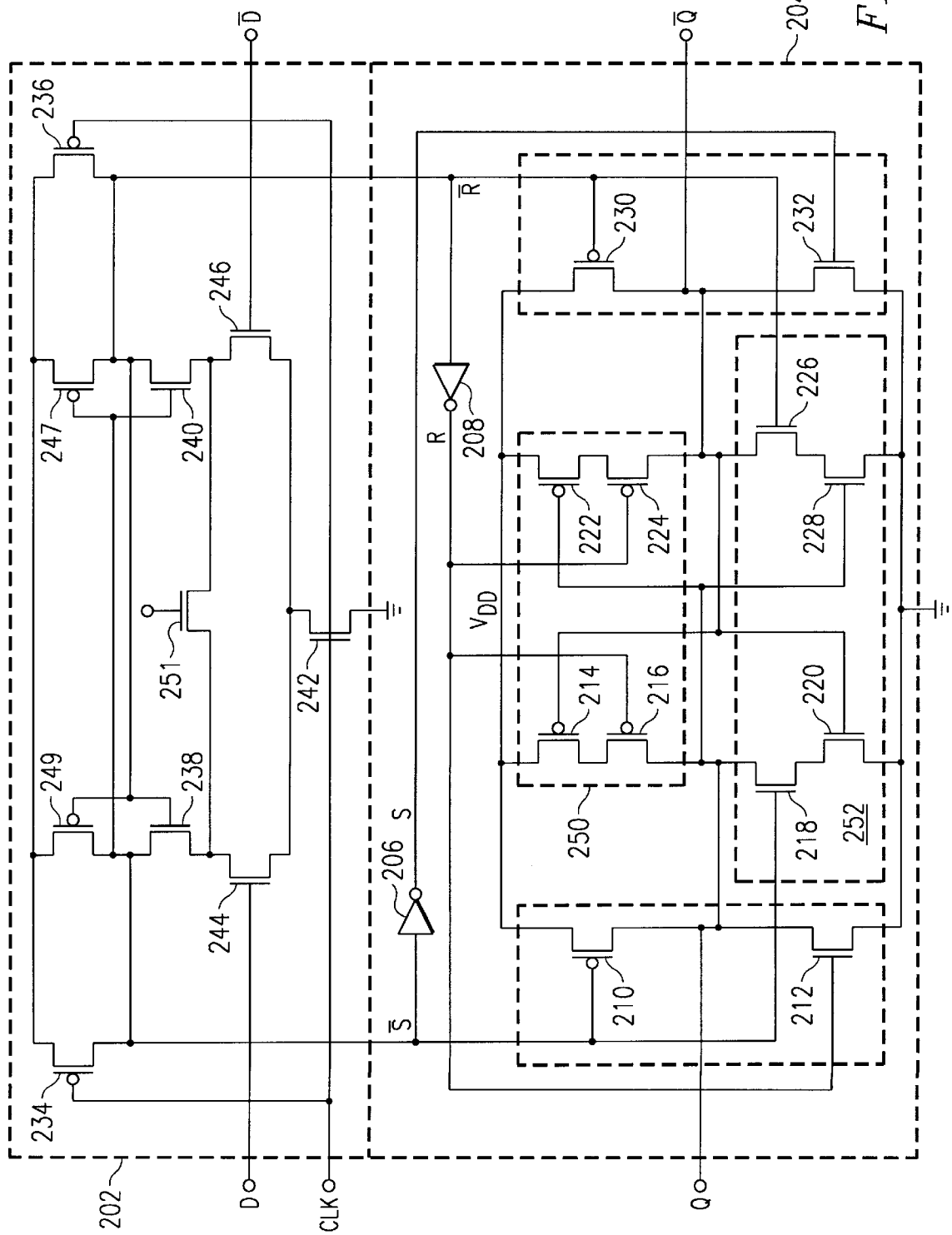
FIG. 2 illustrates a sense-amplifier based flip-flop.

As illustrated in FIG. 2, the present invention provides two possible logic representations for the output Q: $Q=S+\overline{R}Q'$ and $Q=\overline{R}\cdot(S+Q')$, in order to produce four equivalent pull-up and pull-down transistor circuits represented by the following equations:

$$Q=S+\overline{R}Q', (\overline{Q})=R+\overline{S}\cdot Q', \overline{Q}=\overline{S}\cdot(R+\overline{Q}'), (Q)=\overline{R}\cdot(S+Q')$$

The signals Q' and $\underline{Q}$' are the states (or logic) levels of the output in the previous clock cycle.

Pull-up circuits raise the voltage of the node which they connect to the supply voltage. Pull-down circuits lower the voltage of the node which they are connected to ground. Both Q and $\overline{Q}$ have a separate pull-up and pull-down circuit. These circuits are symmetrical with respect to output signals Q and $\overline{Q}$. Signal Q is output from a first current path from $V_{DD}$ to ground, and signal $\overline{Q}$ is output from a second current path from $V_{DD}$ to ground. The first current path includes a first pull-down circuit, transistors FET 212, FET 218 and FET 220, and a first pull-up circuit, transistors PFET 210, PFET 214 and PFET 216.

The second current path includes a second pull-down circuit, FET 232, FET 226 and FET 228, and a second pull-up circuit, PFET 230, PFET 222 and PFET 224.

The output signal Q is high when a current path exists through transistors PFET 214 and PFET 216 or a current path exists through PFET 210.

The output signal Q is low when a current path exists through either FET 218 and FET 220, or FET 212.

The output signal $\overline{Q}$ is high when a current path exists through PFET 222 and PFET 224 or through PFET 230.

The output signal $\overline{Q}$ is low when a current path exists through FET 226 and FET 228 or through FET 232.

As a result of this symmetrical design, the rising and falling edge of signals Q and $\overline{Q}$ are subject to the same delays. This occurs because the signals are in response to signals S and R and signals $\overline{S}$ and $\overline{R}$. These signals control both directly and indirectly the same number and arrangement of circuit elements. This, by proper sizing of transistors, translates in the same delay.

Since the output stage 204 is symmetric with respect to pull-up and pull-down circuits for Q and $\overline{Q}$, the implementation of both pull-ups and pull-downs use the same circuit and thus make the output stage symmetrical. Typically, one transistor "driver" in each branch is active in changing the state, allowing the other transistors, namely keeper transistors, to be small in size. Since PFETs have charge mobility roughly two times slower than NFET, the size of PFET pull-up networks has to be doubled compared to the NMOS networks in a CMOS structure. To achieve the same delays in this structure, it is possible to size the FETs such that the delay of the PMOS network is similar to the delay of the NMOS network following the inverter. (This is important, because in the prior art, no sizing could adjust the delays; there is always going to be one gate delay difference.) One set 250 of keeper transistors are, for example, PFET 214, PFET 222, PFET 216 and PFET 224. Another set 252 of keeper transistors are FET 218, FET 226, FET 220 and FET 228. Since the size of these keeper transistors is small, they can be quickly switched off during any transition which allows driver transistors PFET 210, PFET 230, PFET 212 and PFET 232 to drive the load and to change the state of the latch. The keeper transistors can be switched off quicker than the driver transistors. When both signals $\overline{S}$ and $\overline{R}$ are at high logic levels, transistors PFET 210, PFET 230, FET 212 and FET 232 are off. Additionally, PFET 216, PFET 224, FET 218 and FET 226 are on. This allows transistors PFET 214, PFET 222, FET 220 and FET 228 to keep the present state (logic levels) for both true and complementary outputs. After a rising edge of the clock signal is received, either one of the precharged sense-amplifier outputs, either $\overline{S}$ or $\overline{R}$ discharges to ground. The operation of the sense amplifier 202 dictates that only one of these signals $\overline{S}$ or $\overline{R}$ can discharge at each clock transition. If $\overline{S}$ discharges to a zero state and $\overline{R}$ remains at $V_{DD}$, signal S rises from 0 to $V_{DD}$ after an inverter delay. Since transistors FET 218 and PFET 224 are sized small, they can be switched off quickly, allowing the driver transistors PFET 210 and FET 232 to change the true output Q state to a high logic level $V_{DD}$, and the complementary output to a low level. Conversely, if $\overline{R}$ discharges and $\overline{S}$ stays at $V_{DD}$, signal R rises from 0 to $V_{DD}$ after an inverter delay due to inverter 208. Since transistors FET 226 and PFET 216 are sized small, these transistors can be switched off quickly, allowing the driver transistors PFET 230 and FET 212 to change the true output state Q to logic level 0 and the complementary output $\overline{Q}$ to $V_{DD}$.

When the clock signal is low or logical zero, the nodes $\overline{S}$ and $\overline{R}$ are precharged to voltage $V_{DD}$ through transistors PFET 234 and PFET 236. The transistors PFET 234 and PFET 236 are sized to charge nodes $\overline{S}$ and $\overline{R}$ in ½ clock CLK cycles. The high state of $\overline{S}$ and $\overline{R}$ keeps transistors FET 238 and FET 240 in on state, charging the sources of transistors FET 238 and FET 240 up to $V_{DD}-V_{tN}$ ($V_{tN}$ is the threshold of N channel MOS FET) because there is no path to ground due to the off state of transistor 242. Since either transistor FET 244 or transistor FET 246 is on, the common node of transistors FET 244, FET 246 and FET 242 are precharged to $V_{DD}-V_{tN}$. Therefore, prior to a leading edge of the clock signal CLK, all capacitances in the differential tree are recharged.

The sense amplifier stage 204 is triggered on the leading edge of the clock signal CLK. If D signal is high, node $\overline{S}$ is discharged through the path of transistors FET 238, FET 244 and FET 242, turning transistor FET 240 off and transistor PFET 247 on. If $\overline{D}$ is high, node $\overline{R}$ is discharged through the path of transistors FET 240, FET 246 and FET 242, turning transistor FET 238 off and transistor PFET 249 on. After this initial change, further changes of data inputs will not affect the state of the $\overline{S}$ and $\overline{R}$ nodes. The inputs are decoupled from the outputs of the sense-amplifier forming the base for the flip-flop operation of the circuit.

The output Q of the sense amplifier 204 which is forced low at the leading edge of the clock signal subsequently becomes floating low if the data changes after the leading edge of the clock. The transistor 251 allows static operation, providing a path to ground even after the data has changed. This prevents potential charging of the low output of the sense-amplifier stage, due to the leakage currents, which cannot be neglected in deep-submicron technology designs.

High-speed digital systems create large fan-outs at flip-flop outputs, which puts additional requirements on the flip-flop design by scaling the sizes of transistors PFET 210, PFET 230, FET 212 and FET 232. In addition, their size can be adjusted such that both transitions of the output, from high to low and from low to high, have the same delay by matching the delay of the PMOS FETs to the delay of the inverter and the NMOS FETs.

Figure 4:
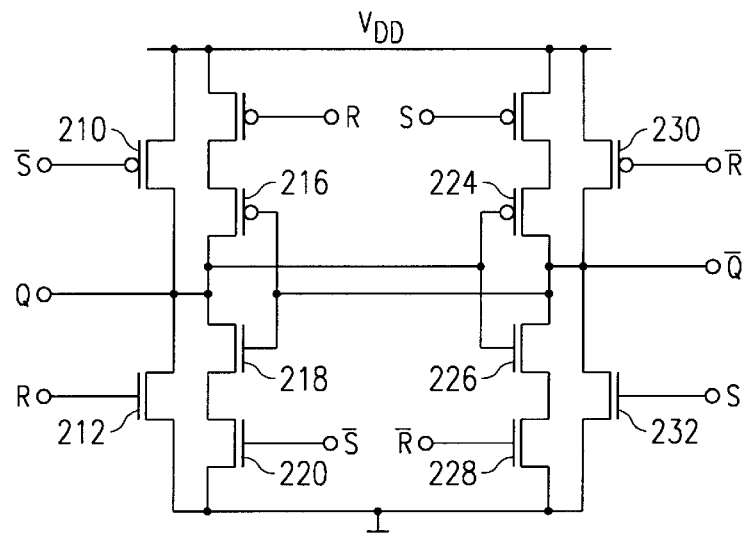
FIG. 4 illustrates an S-R latch with equal output delays and truth table.

The present invention avoids the cross-coupled NAND gates of the conventional S-R latch which is the main speed bottleneck of the flip-flop. The present invention prevents the one gate delay difference caused by the cross-coupled NAND gates of the rising and falling edge of the differential outputs. FIG. 4 illustrates the truth table of the S-R latch and equation 1 shows the complementary outputs of the latch.

$$Q = S + \bar{R}Q'$$

$$\overline{Q} = \bar{R} \cdot (S + Q')$$

Figure 5:
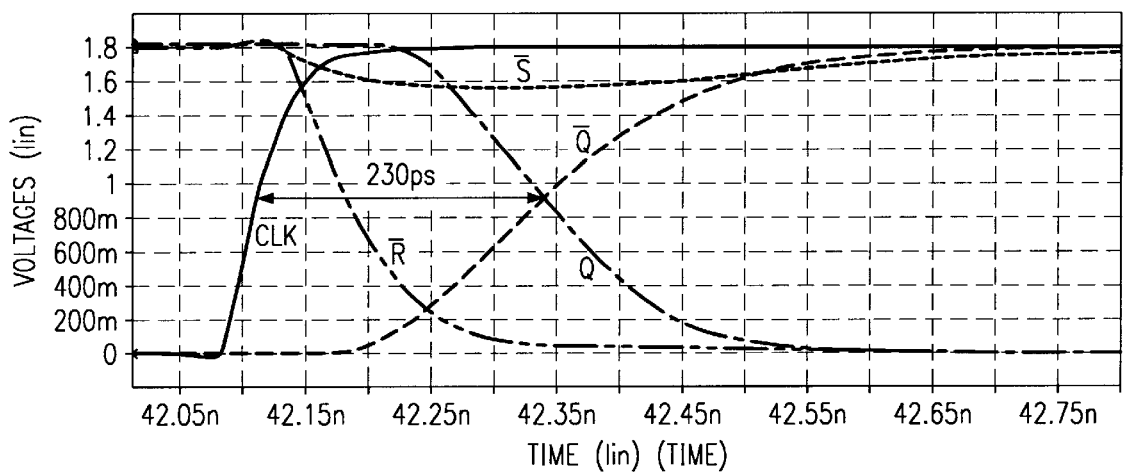
FIG. 5 illustrates typical sense-amplifier flip-flop waveforms.

FIG. 4 illustrates two complementary branches producing the outputs Q and $\overline{Q}$. Thus, the true and complementary trees are symmetrical, resulting in equal delays of both outputs as shown in the simulation of FIG. 5. Furthermore, the latch of the present invention does not have sizing problems due to different action of the transistors on the nodes.

Figure 6:
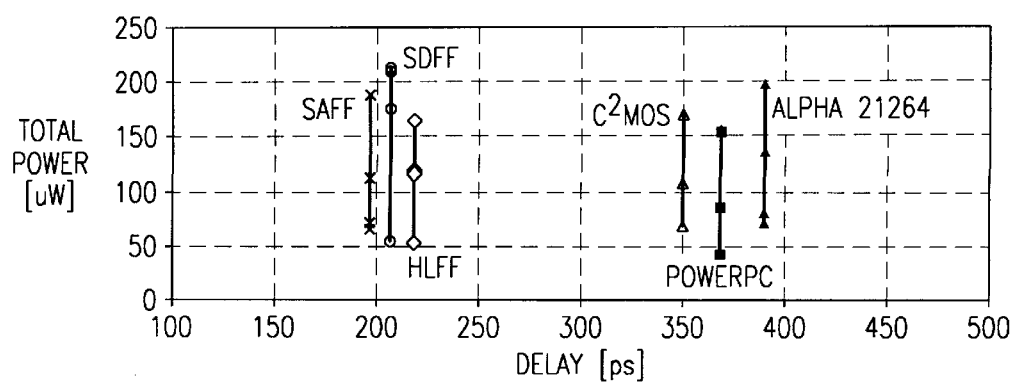
FIG. 6 illustrates a comparison of delays and power between different flip-flops.

FIG. 6 shows the results of the present structure in terms of delay with comparable power dissipation. Thus, the present invention provides a second stage structure having a delay which is the same for true and complementary outputs. The optimization of the transistor sizes of the second stage S-R is possible, allowing for very fast operation. The results depend on transistor size and conditions of simulation and comparison and is also process dependent. This example was with CMOS, effective channel length of 0.18 um, nominal process corner, temperature of 20° C., supply voltage 1.8V, a clock frequency of 500 MHz, clock and data signal rise and fall times of 100 ps, a load of 200 fF at the output, and the delay is defined as the sum of setup time plus clock-to-output delay. Additionally, the transistor sizes in the flip-flop are optimized to drive 200 fF load with the layout limit in the size of the output transistors (max PMOS 7.5 um, max NMOS is 4.3 um).

Turning now to FIG. 2, the second stage 204 includes an inverter 206 to invert the signal $\overline{S}$ to the signal S and an inverter 208 to invert the signal $\overline{R}$ and to output R signal. A gate of PFET 210 is connected to receive signal $\overline{S}$. The gate of PFET 210 is connected to the drain of PFET 234. The source of PFET 210 is connected to voltage $V_{DD}$. The gate of FET 212 is connected to the output of inverter circuit 208. Thus, the gate of transistor 212 is controlled by the signal R. The drain of transistor FET 212 is connected to the drain of PFET 210. The source of FET 212 is connected to the source of FET 222 and additionally connected to ground. The gate of FET 222 is connected to the drain of FET 226 as well as the gate of PFET 214. The drain of FET 222 is connected to the source of FET 218. The drain of FET 218 is connected to the drain of PFET 216. Additionally, the drain of FET 218 is connected to output Q. The source of PFET 216 is connected to the drain of PFET 214. The source of PFET 214 is connected to the source of PFET 210. The gate of FET 228 is connected to the gate of FET 222. The source of FET 228 is connected to ground with the drain of FET 228 connected to the source of FET 226. The drain of FET 226 is connected to the drain of PFET 224, and the source of PFET 224 is connected to the drain of PFET 222. The gate of PFET 224 is connected to the output of inverter 206 to receive the signal S. The gate of FET 230 is connected to the output of inverter 206. The output of inverter 206 is signal S which controls FET 232 and PFET 224. The source of FET 232 is connected to ground while the drain of FET 232 is connected to the drain of PFET 230. The gate of PFET 230 is connected to the drain of PFET 236. The signal $\overline{R}$ controls the gate of PFET 230. The source of PFET 230 is connected to the source of PFET 214 and the source of PFET 214, PFET 210 and PFET 222.

Furthermore, interchanging the connection of devices 214 and 216, or 222 and 224, or 218 and 220, or 226 and 228 does not change the functionality of the circuit, but may slightly slow it down.

What is claimed is:

1. A flip-flop circuit comprising:

a first stage for receiving data and generating monotonous transitions of S and R signals;

a second stage for receiving said S and R signals and generating a Q output signal and $\overline{Q}$ output signal; and said second stage implementing Q=S+$\overline{R}$Q' and Q= $\overline{R}$·(S+Q') equations such that wherein said Q output signal and said $\overline{Q}$ output signal have equal rising and falling transitions with the same delays for said Q output signal and said $\overline{Q}$ output signal.

2. A flip-flop circuit as in claim 1, wherein said second stage has symmetrical pull-up circuits.

3. A flip-flop circuit as in claim 1, wherein said second stage has symmetrical pull-down circuits.

4. A flip-flop circuit as in claim 1, wherein said second stage has symmetrical keeper circuits.

5. A flip-flop circuit as in claim 1, wherein said second stage has symmetrical driver circuits.

* * * * *